US010482989B1

(12) United States Patent
Gregor et al.

(10) Patent No.: US 10,482,989 B1
(45) Date of Patent: Nov. 19, 2019

(54) DYNAMIC DIAGNOSTICS ANALYSIS FOR MEMORY BUILT-IN SELF-TEST

(71) Applicant: Cadence Design Systems, Inc., San Jose, CA (US)

(72) Inventors: Steven Lee Gregor, Oswego, NY (US); Puneet Arora, Noida (IN); Norman Robert Card, Vestal, NY (US)

(*) Notice: Subject to any disclaimer, the term of this patent is extended or adjusted under 35 U.S.C. 154(b) by 83 days.

(21) Appl. No.: 15/903,916

(22) Filed: Feb. 23, 2018

(51) Int. Cl.
*G11C 29/38* (2006.01)
*G11C 29/44* (2006.01)

(52) U.S. Cl.
CPC .............. *G11C 29/38* (2013.01); *G11C 29/44* (2013.01)

(58) Field of Classification Search
CPC .............................. G11C 29/38; G11C 29/44
See application file for complete search history.

(56) References Cited

U.S. PATENT DOCUMENTS

| | | | | |
|---|---|---|---|---|
| 5,138,619 A | * | 8/1992 | Fasang | G11C 29/14 714/718 |
| 5,258,986 A | * | 11/1993 | Zerbe | G11C 29/10 365/201 |
| 5,471,482 A | * | 11/1995 | Byers | G11C 29/10 714/718 |
| 5,557,619 A | * | 9/1996 | Rapoport | G11C 29/14 714/718 |
| 5,640,354 A | * | 6/1997 | Jang | G11C 29/44 365/189.011 |
| 6,081,910 A | * | 6/2000 | Mifsud | G11C 29/44 714/718 |
| 6,658,611 B1 | * | 12/2003 | Jun | G11C 29/16 365/201 |
| 8,312,332 B2 | * | 11/2012 | Leininger | G01R 31/31922 714/45 |
| 2003/0217313 A1 | * | 11/2003 | Pfeiffer | G11C 29/12 714/719 |
| 2008/0082874 A1 | * | 4/2008 | Kato | G11C 29/44 714/723 |
| 2010/0257343 A1 | * | 10/2010 | Klug | G06F 21/75 712/227 |
| 2013/0326111 A1 | * | 12/2013 | Arsovski | G11C 15/04 711/102 |

* cited by examiner

*Primary Examiner* — Joseph D Torres
(74) *Attorney, Agent, or Firm* — Tarolli, Sundheim, Covell & Tummino LLP

(57) ABSTRACT

Systems and methods disclosed herein provide for improved diagnostics for memory built-in self-test ("MBIST"). Embodiments provide for a two-pass diagnostic test of the target memory, wherein, in the first pass, a data compare unit provides clock cycle values associated with detected miscompares to a tester, and, in the second pass, the data compare unit extracts data vectors associated with the clock cycle values. Embodiments further provide for a bit fail map report that is generated based on the extracted data vectors.

20 Claims, 4 Drawing Sheets

System 100

System 100

| command | address | cycle | rportv |
|---------|---------|-------|--------|
| w0 | 0 | 0 | 0 |
| w0 | 1 | 1 | 0 |
| w0 | 2 | 2 | 0 |
| w0 | 3 | 3 | 0 |
| r0 | 0 | 4 | 1 |
| w1 | 0 | 5 | 0 |
| r0 | 1 | 6 | 1 |
| w1 | 1 | 7 | 0 |
| r0 | 2 | 8 | 1 |
| w1 | 2 | 9 | 0 |
| r0 | 3 | 10 | 1 |
| w1 | 3 | 11 | 0 |
| r1 | 0 | 12 | 1 |
| r1 | 1 | 13 | 1 |
| r1 | 2 | 14 | 1 |
| r1 | 3 | 15 | 1 |

DYNAMIC DIAGNOSTICS ANALYSIS FOR MEMORY BUILT-IN SELF-TEST

TECHNICAL FIELD

The present application relates to an improved diagnostics system and method for memory built-in self-test.

BACKGROUND

Memory built-in self-test ("MBIST") refers to the self-testing of a memory within an integrated circuit chip. With MBIST, it can be determined if the tested memory includes any failing data bits. Specifically, the MBIST generates a bit fail map report, which indicates the failing data bits during a certain diagnostics test of the memory. Previously, in order to properly test the memory, additional information associated with the failing data bit had to be stored alongside the memory itself. For example, the MBIST hardware included registers for storing the failing algorithm, target, address, and data bits per engine, respectively. In addition, the MBIST hardware also included pipeline stages to retain all of the above information (i.e., failing algorithm, target, address, and data bits per engine) in order to sync failure indication information with other information determined during the diagnostics. All of this additional hardware required significant area in the chip die. For many chip designers, the area taken up by this additional MBIST hardware reduced the amount of actual functionality they were able to put on the chip die. Further, in order to generate the bit fail map report, previous systems required software analysis to be performed after every cycle, i.e., cycle-by-cycle analysis. As such, for diagnostics involving a large amount of stored information (i.e., failing algorithm, target, address, and data bits per engine), there was an associated huge run-time cost as well.

Accordingly, there is a need for an MBIST diagnostics system utilizing less memory and, therefore, less area in the chip die.

DESCRIPTION OF EMBODIMENTS

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide MBIST diagnostics systems and methods utilizing less memory and, therefore, less area in the chip die. The systems and methods herein address at least one of the problems discussed above.

According to an embodiment, an MBIST diagnostics system includes a memory, wherein the memory is tested with an algorithm for a plurality of passes; a data compare unit; a tester; and a processor, wherein:

during a first pass of the test, the data compare unit is configured to provide, to the tester, a clock cycle associated with a word of the memory including at least one mis-compare, during at least a second pass of the test, the data compare unit is further configured to (i) extract contents of the word based on the corresponding clock cycle and (ii) provide the extracted contents of the word to the tester, and the processor is configured to generate a bit fail map report based on the extracted contents of the word, wherein the bit fail map report includes information associated with the at least one mis-compare.

According to an embodiment, a diagnostics method for MBIST includes testing a memory with an algorithm for a plurality of passes, wherein:

during a first pass of the test: providing, with a data compare unit, a clock cycle associated with a word of the memory including at least one mis-compare to a tester, during at least a second pass of the test: extracting, with the data compare unit, contents of the word based on the corresponding clock cycle, and providing, with the data compare unit, the extracted contents of the word to the tester; and generating, with a processor, a bit fail map report based on the extracted contents of the word, wherein the bit fail map report includes information associated with the at least one mis-compare.

Figure 1:
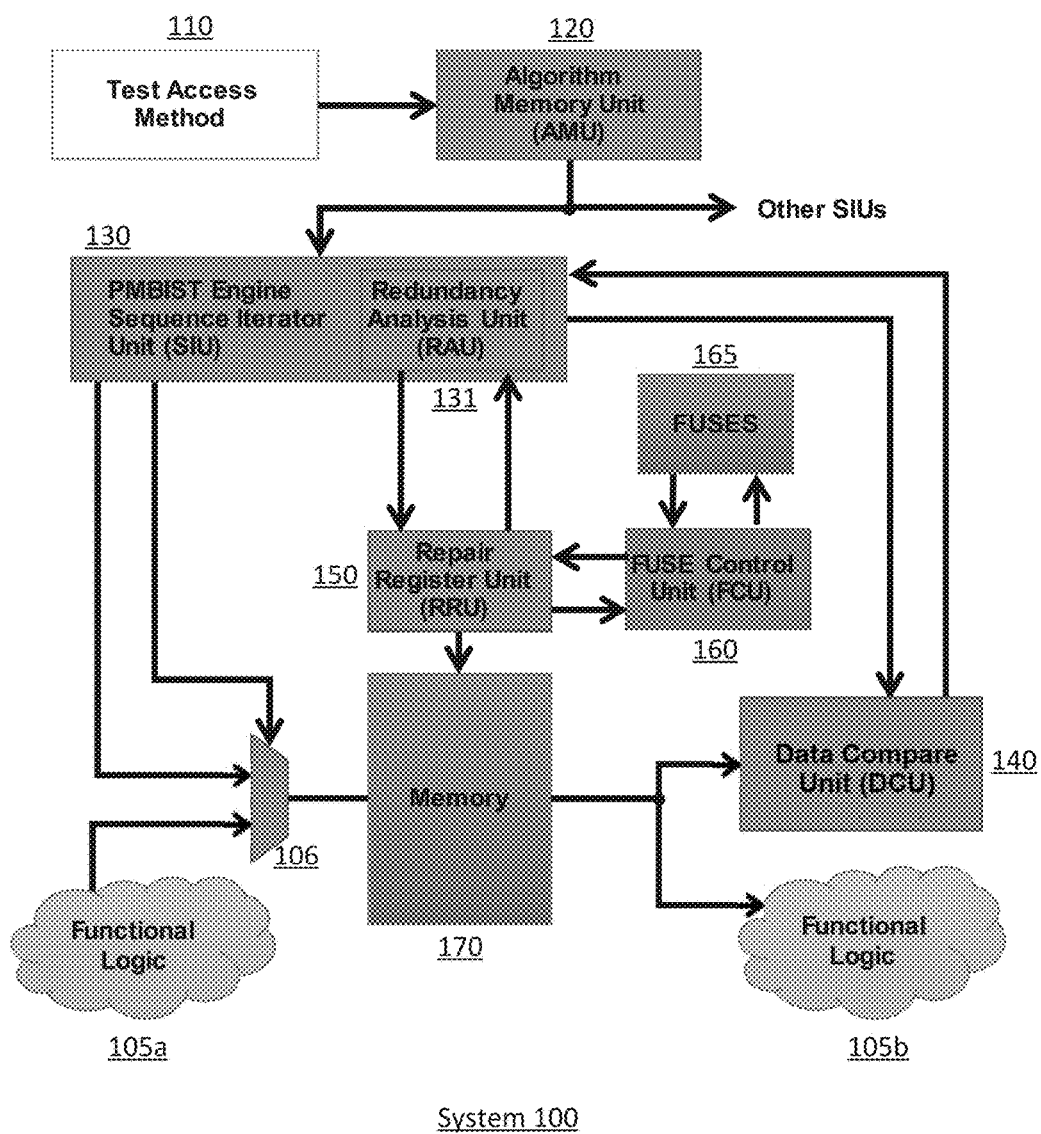
FIG. 1 illustrates an example embodiment of an MBIST diagnostics system.

FIG. 1 illustrates an example embodiment of an MBIST diagnostics system. As depicted in the figure, MBIST diagnostics system 100 includes a test access method ("TAM") 110, algorithm memory unit ("AMU") 120, sequence iterator unit ("SIU") 130, data compare unit ("DCU") 140, repair register unit ("RRU") 150, fuse control unit ("FCU") 160, fuses 165, and memory 170. In an embodiment, the TAM 110 is a means of communicating from outside the chip. In an embodiment, the TAM 110 can be implemented through either a "Joint Test Action Group" ("JTAG") or "Direct Access" interface. In an embodiment, the JTAG interface includes a plurality of pins (e.g., four or five pins) that are utilized to extract test information during the memory test. In an embodiment, the "Direct Access" interface corresponds to a different set of pins that doesn't require quite the complexity of the JTAG interface. For example, the "Direct Access" interface only requires a set of two pins. Further, because the "Direct Access" pins can be shared with some other ports, no additional overhead is required. Therefore, in an embodiment, the "Direct Access" interface can internally mimic the behavior of JTAG Macros but, instead, with minimum area requirements. In an embodiment, the AMU 120 contains the programs (e.g., algorithms) that run in the MBIST logic against the memory 170. In an embodiment, the AMU 120 distributes the above program information into the SIU 130. Specifically, a program previously-loaded onto the AMU 120 is distributed one line at a time to the SIU 130. In an embodiment, the SIU 130 generates the command and address sequence of the data that gets presented to the memory 170 when (i) data is being written onto the memory 170, (ii) data is being presented for comparison, and (iii) the memory 170 is being read. In an embodiment, the SIU 130 may include a redundancy analysis unit ("RAU") 131. In an embodiment, the RAU 131 determines (i) what the failures look like within a given memory and (ii) whether or not redundant resources can be utilized to repair the failures. Further, in an embodiment, the RRU 150 controls the hard or soft repair on the memory 170, e.g., via the FCU 160 and the fuses 165, based on instructions from the RAU 131. In an embodiment, the SIU 130 feeds both (i) the command and address sequence into the memory 170 and (ii) expected data into a first input of the DCU 140. Then, based on the command and address sequence fed into the memory 170, the memory 170 generates an output, which is received by another input of the DCU 140. In an embodiment, the DCU 140 compares the expected data from the SIU 130 with the output from the memory 170. In an embodiment, the expected data from the SIU 130 is received by the DCU 140 at the same time as the output from the memory 170. In an embodiment, based on the comparison, the DCU 140 is then able to determine if the memory 170 includes any failing data bits. For example, if the DCU 140 determines that the expected values are equivalent to the output from the memory 170, then it is likely that the associated data bits are functioning properly. However, if the DCU 140 detects any mis-compares, then it is likely that the associated data bits are not functioning properly, i.e., failing. After the comparison, the DCU 140 transmits the result of the comparison, i.e., working or failing, to the SIU 130 for further processing by the RAU 131. In an embodiment, a working bit may be associated with a logical value of "0," while a failing bit may be associated with a logical value of "1." Further, in an embodiment, the system 100 also includes functional logic 105a and 105b and a multiplexer 106. In an embodiment, the multiplexer 106 allows either (i) the data from the SIU 130 to be fed into the memory 170 during a test or (ii) via the regular functional path, e.g., the functional logic 105a into the memory 170. On the output side of the memory 170, the output goes to the DCU 140 for comparison purposes and also to the non-test mode logic of the design, e.g., functional logic 105b. In an embodiment, the system 100 can also include a plurality of other SIUs 130. As such, each SIU 130 can interact with one or more memories 170 and associated DCUs 140.

Figures 2, 3:
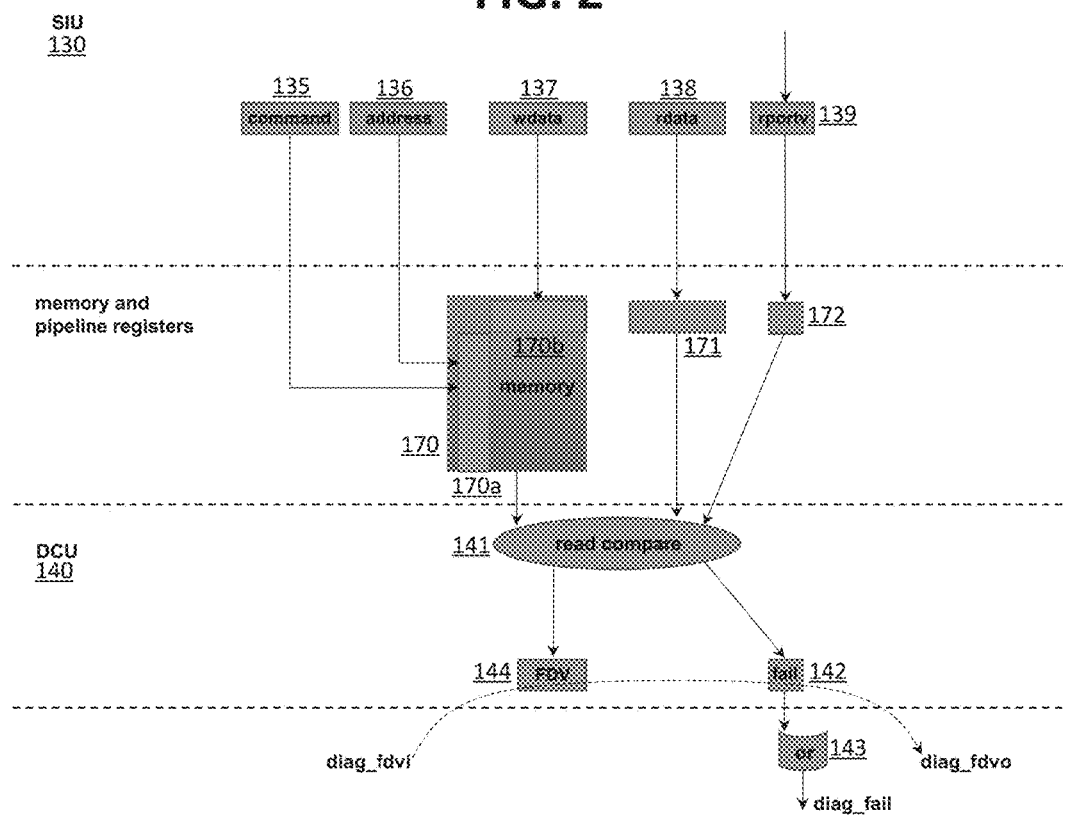
FIG. 2 illustrates an interaction between the elements of the MBIST diagnostics system of FIG. 1 in accordance with an example embodiment of the present invention.
FIG. 3 illustrates a sequence of commands for an algorithm utilized by the MBIST diagnostics system of FIG. 2 in accordance with an example embodiment of the present invention.

FIG. 2 illustrates an interaction between the elements of the MBIST diagnostics system of FIG. 1 in accordance with an example embodiment of the present invention. Specifically, FIG. 2 depicts the interaction between the SIU 130, the DCU 140, and the memory 170. In an embodiment, the SIU 130 includes command register 135, address register 136, wdata register 137, rdata register 138, and rportv register 139. In an embodiment, the SIU 130 decomposes an algorithm into a set of instructions, i.e., command, address, wdata, rdata, and rportv, which are then stored in their respective registers. The command instruction is one of read or write. The address corresponds to the location within the memory 170 to be accessed. Wdata is the data to be written into memory 170 on a write command. Rdata is the data to be compared against the contents read from the memory 170. Rportv indicates that a valid read command is being processed. In an embodiment, the pipeline stages are associated with the memory and pipeline registers (i.e., registers 170a, 170b, 171, and 172) used in conjunction with the memory 170 and other registers during the test of memory 170. For example, register 170a temporarily stores the command and address information provided by the command register 135 and the address register 136, respectively. Register 170b temporarily stores the data to be written into memory 170 provided by the wdata register 137. Register 171 temporarily stores data to be compared against the contents read from the memory 170 provided by the rdata register 138. Register 172 temporarily stores the indication that a valid read command is being processed provided by the rportv register 139. In an embodiment, the DCU 140 includes read compare logic 141, fail indication signal 142, a logical OR fail tree 143, and a failing data vector ("FDV") 144. In an embodiment, the read compare logic 141 compares all the memory read (i.e., actual) data against the rdata (i.e., expected) content. In an embodiment, the read compare logic 141 is an EXCLUSIVE OR logic gate that receives, as inputs the actual read data (i.e., output contents from the memory 170), the expected read data (i.e., output from the register 171), and an indication that a valid read command is being processed (i.e., output from the register 172). Further, in an embodiment, the actual read data and the expected read data is received by the read compare logic 141 a memory word at a time. For example, if a memory word is thirty-two bits long (e.g., 31:0), then the read compare logic 141 will compare thirty-two bits of the actual read data from the memory 170 with thirty-two bits of the corresponding expected data from the register 171. In an embodiment, the read compare logic 141 generates a result of the comparison of the actual read data and the expected read data and stores the result of the comparison in the FDV 144. In an embodiment, a compare is performed after each clock cycle of the test. In an embodiment, each bit of the actual read data word is simultaneously compared with the corresponding bit of the expected read data word. For example, bit 0 of the actual read data word is compared with bit 0 of the expected read data word, and so on and so forth. Further, because the read compare logic 141 includes an EXCLUSIVE OR logic gate, if bit 0 of the actual read data word and bit 0 of the expected read data word are associated with different values (i.e., mis-compare), then the corresponding bit 0 in the FDV 144 will be associated with a logical value of "1." On the other hand, if bit 0 of the actual read data word and bit 0 of the expected read data word are associated with the same value (i.e., match), then the corresponding bit 0 in the FDV 144 will be associated with a logical value of "0." Therefore, after every clock cycle in the test, the FDV 144 will include the potential mis-compare information for the word associated with that particular clock cycle. In an embodiment, if any of the bits in the FDV 144 include a mis-compare, i.e., a logical value of "1," then the fail indication signal 142 will indicate a failure for that particular clock cycle. In an embodiment, a failure indication for the fail indication signal 142 is associated with a logical value of "1." Otherwise, if none of the bits in the FDV 144 include a mis-compare, then the fail indication signal 142 will not indicate a failure for that particular clock cycle. In an embodiment, a non-failure indication is associated with a logical value of "0." In an embodiment, the logical OR fail tree 143 accumulates the individual failure signals from the fail indication signal 142 into a single data register, e.g., diag_fail. Specifically, the logical OR fail tree 143 includes a fail signal from each DCU 140, with all active DCU 140 fail signals being "ORed" together to produce diag_fail. In an embodiment, diag_fail can be accessed by a tester, e.g., automated test equipment ("ATE") (not shown), via the TAM 110. In an embodiment, the value in diag_fail is provided to the tester after each failing clock cycle, i.e., when the fail indication signal 142 indicates a failure. Further, in an embodiment, the values in the FDV 144 are captured by a test data register ("TDR"), e.g., DIAG_FDV, that can be accessed by the tester via the TAM 110. In an embodiment, the values in the FDV 144 are captured via the input of the TDR, e.g., diag_fdvi. Further, the tester accesses the information on the TDR via the output of the TDR, e.g., diag_fdvo. In an embodiment, each of the registers 135, 136, 137, 138, 139, 142, 144, 170a, 170b, 171, and 172 are clocked on the rising edge of a clock cycle. Further, in an embodiment, because each SIU 130 can interact with one or more memories 170 and associated DCUs 140, multiple target memories can be tested concurrently.

FIG. 3 illustrates a sequence of commands for an algorithm utilized by the MBIST diagnostics system of FIG. 2 in accordance with an example embodiment of the present invention. In an embodiment, a number of pre-defined and user-defined algorithms can be utilized by the MBIST diagnostics system 100. Pre-defined algorithms are built into an application. User-defined algorithms are defined in the configuration file. In an embodiment, the command sequences depicted in FIG. 3 are associated with the following sample algorithm:
{
(w0)
(r0,w1)
(r1)
},
where "w0" corresponds to a write true background command, "r0" corresponds to a read true background command, "w1" corresponds to a write complement background command, and "r1" corresponds to a read complement background command.

In an embodiment, the set of commands in each parenthesis is executed against each address in memory before moving onto the next line. Further, the command sequences depicted in FIG. 3 assume a memory that is four words in size with addresses 0, 1, 2, and 3, respectively. As depicted in the figure, a command instruction is presented to a targeted memory address at a certain clock cycle. Lastly, the rportv indicates when a read command is active in a given cycle.

Figure 4A:
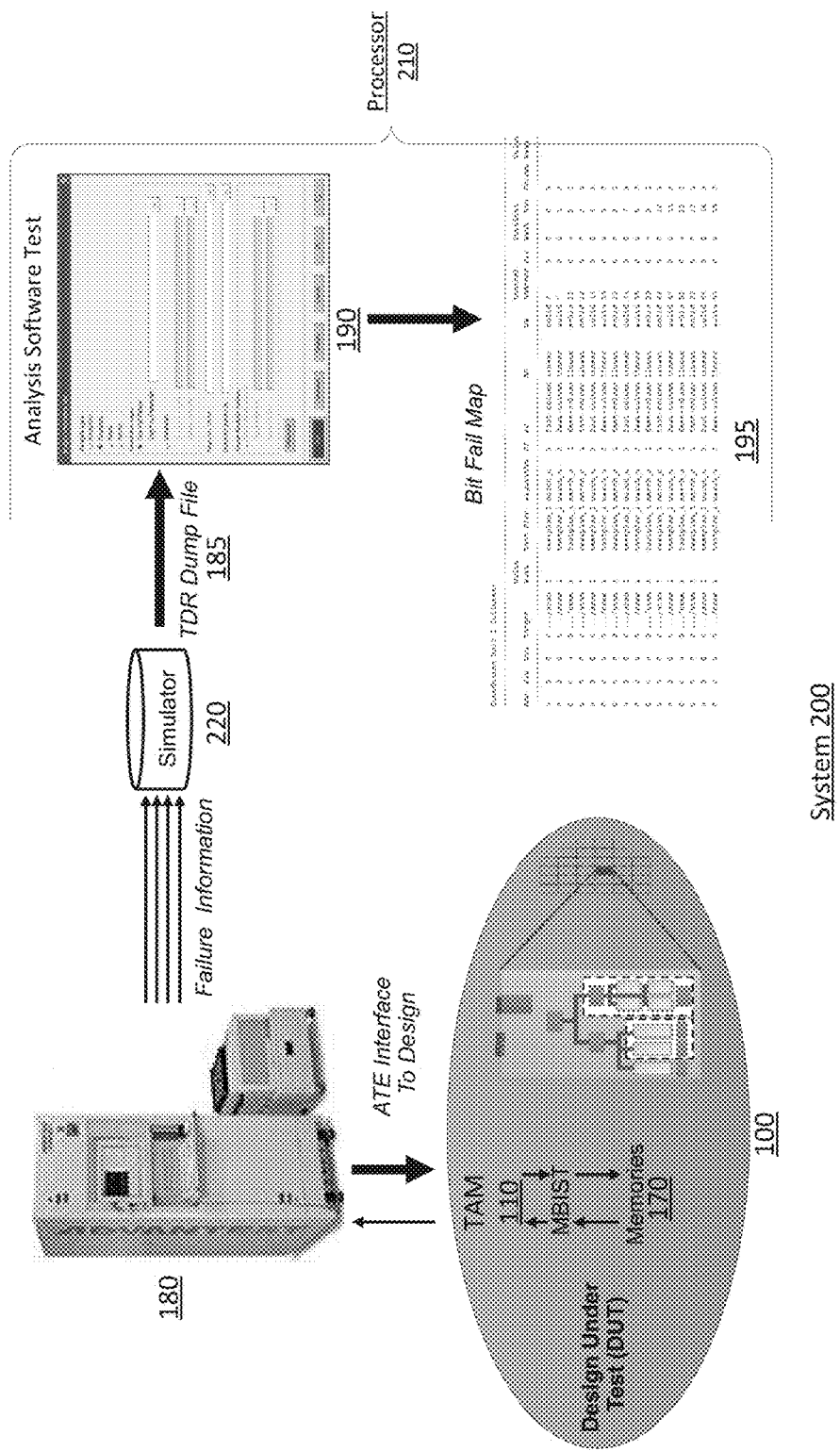
FIG. 4A illustrates a diagnostics system in accordance with an example embodiment of the present invention.

FIG. 4A illustrates a diagnostics system in accordance with an example embodiment of the present invention. In an embodiment, a diagnostic system 200 includes the MBIST diagnostic system 100, a ATE 180, a TDR dump file 185, an analysis software test 190, a bit fail map report 195, a processor 210, and a simulator 220. In an embodiment, the MBIST diagnostic system 100 may interact with the ATE 180 via the TAM 110. For example, the MBIST diagnostic system 100 may interact with the ATE 180 during a two-pass diagnostic test of a targeted memory 170. In an embodiment, during a first diagnostic pass, the ATE 180 collects the failing tester cycles for the targeted memory 170. Specifically, the ATE 180 retrieves the diag_fail signal from the system 100 and, therefore, determines all of the clock cycles associated with a failure indication from the fail indication signal 142. In an embodiment, the retrieved failing tester cycles are stored in a memory in the ATE 180. In an embodiment, once this set of failing tester cycles is determined per targeted memory, the number of tester cycles to be executed for each detected failure to permit the capture of failure data for the memory is calculated. Specifically, the retrieved failing tester cycles are negatively adjusted based on the distance of pipeline stages between the actual detection of the failure and the eventual later reporting of the failure. In an embodiment, the adjusted failing tester cycles are stored in a memory in the ATE 180. Then, during a second diagnostic pass, the FDV 144 values associated with the adjusted failing tester cycles are extracted to the ATE 180. For example, for the first detected failing tester cycle, the system 100 re-executes the test performed during the first diagnostic pass until the first adjusted tester cycle is reached. Then, after the first adjusted tester cycle is reached, the corresponding FDV 144 values are captured and extracted to the ATE 180. Specifically, at the first adjusted tester cycle, the FDV 144 values are captured by a TDR, e.g., MBISTDIAG, and then extracted, via the TAM 110, to the ATE 180. In an embodiment, the system 100 re-executes the test performed during the first diagnostic pass for each following detected failing tester cycle. Accordingly, for the following detected failing tester cycles, the system 100 re-executes the diagnostics test until the particular adjusted tester cycle is reached, thereby ensuring the same dynamic behavior in the memory under test as the first diagnostic pass. Then, after the respective adjusted tester cycles are reached, the corresponding FDV 144 values are captured and extracted to the ATE 180 as described for the first adjusted tester cycle. In an embodiment, the FDV 144 values associated with the respective adjusted tester cycles are stored in a memory in the ATE 180. In an embodiment, after the two-pass diagnostic test, additional post-processing of the collected failure data is performed. For example, using a functionally-accurate model of the system 100, a test of the targeted memory is performed in a simulation environment with the simulator 220. In an embodiment, during the simulation environment test, information is extracted from the simulation environment that is not available from the ATE 180. For example, during the simulation environment test, the corresponding TDR contents (e.g., test plan registers, target scheduling registers, and programmable algorithm registers), sequence iterator contents, write port, and address are extracted at each adjusted tester cycle. In an embodiment, the test plan register (e.g., MBISTTPN) includes information regarding the selected set of test plans that are going to be run against the memory during the particular diagnostics test. In an embodiment, a test plan includes a set of one or more algorithms as well as a set of test conditions associated with the algorithms. In an embodiment, the test conditions may include the address order (e.g., fast column, fast row, or fast diagonal), the address update (e.g., linear or complement), the data background, and the sequence iterator. In an embodiment, the test scheduling register (e.g., MBISTSCH) includes the scheduling information for the set of target memories that are going to be running a particular set of test plans. In an embodiment, the programmable algorithm register (e.g., MBISTAMR) includes any programmed algorithms. In an embodiment, the programmable algorithm register is only included if programmed test plans are utilized. As a result of the simulation environment test, the extracted simulation environment information can include the corresponding algorithm (e.g., test plan), read address, and actual/expected mis-comparing data extracted at each adjusted tester cycle. In an embodiment, the failure information (e.g., adjusted tester cycles and corresponding FDV values) and the extracted simulation environment information are stored in a separate file. For example, the failure information and the extracted simulation environment information may be stored in a comma-separated value list, e.g., the TDR dump file 185. In another embodiment, the simulation environment test of the targeted memory can be performed before or concurrently with the two-pass diagnostic test. In this case, the adjusted tester cycles would still need to be determined (i.e., with the two-pass diagnostic test) and utilized in order to extract the relevant simulation environment information. However, there is no need for an additional simulation environment test after the two-pass diagnostic test if one has already been performed. Instead, the simulator 220 extracts the relevant simulation environment information based on the adjusted tester cycles provided by the ATE 180. Then, similar to the previous embodiment, the failure information and the extracted simulation environment information are stored in the TDR dump file 185. In an embodiment, the TDR dump file 185 is provided to the analysis software test 190 to generate the bit fail map report 195. In an embodiment, the analysis software test 190 and the bit fail map report 195 are implemented with the processor 210. Further, as discussed above, because each SIU 130 can interact with one or more memories 170 and associated DCUs 140, multiple target memories can be tested concurrently with the two-pass diagnostic test and the corresponding simulation environment test. In an embodiment, the multiple target memories could be tested with the same or different algorithms.

Figures 4B, 4C:
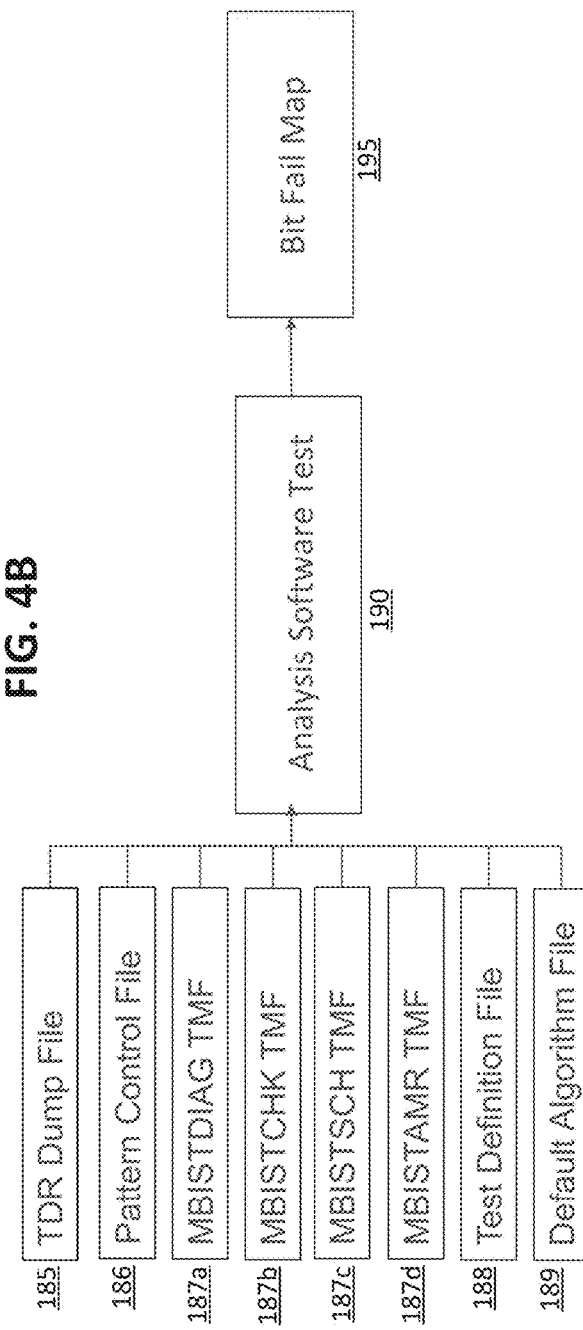
FIG. 4B illustrates an example embodiment of the inputs for the analysis software test in FIG. 4A.
FIG. 4C illustrates another embodiment of the bit fail map in FIGS. 4A and 4B.

FIG. 4B illustrates an example embodiment of the inputs for the analysis software test in FIG. 4A. For example, in addition to the TDR dump file 185, the analysis software test 190 also receives a pattern control file 186, a plurality of TDR mapping files ("TMFs") 187*a-d* (e.g., MBISTDIAG, MBISTCHK, MBISTSCH, MBISTAMR), a test definition file 188, and a default algorithm file 189. In an embodiment, the pattern control file 186 includes information about all of the inserted MBIST hardware as well as the features associated with each of the memories being tested. Further, in an embodiment, TMF 187*a*, e.g., MBISTDIAG, includes the relevant failure information (e.g., adjusted tester cycles and corresponding FDV values) associated with a particular test of the memory. Further, in an embodiment, TMF 187*b*, e.g., MBISTCHK, includes which data bits actually mis-compared during a test of a particular set of devices and, therefore, can be utilized to indicate if there was a failure during the test (i.e., by correlating the mis-compare information from the TDR dump file 185 to the data bits that actually mis-compared during the test). Accordingly, if TMF 187*b* indicates that there was no failure during the test of the particular set of devices, application of the analysis software test 190 will not be necessary. On the other hand, if TMF 187*b* indicates that there was a failure during the test of the particular set of devices, application of the analysis software test 190 will be necessary. Further, in an embodiment, TMF 187*c*, e.g., MBISTSCH, includes the scheduling information for the set of target memories that are going to be running a particular set of test plans. Further, in an embodiment, TMF 187*d*, e.g., MBISTAMR, includes the programmed test plans. In an embodiment, the TMF 187*d* is only included if programmed test plans are utilized. On the other hand, if the test plans are hardwired-in, the TMF 187*d* is not necessary. Further, in an embodiment, the test definition file 188 includes the configuration information for the MBIST hardware, test plans, and algorithms utilized during a particular test. In an embodiment, when the TMF 187*d* is unloaded and analyzed in the analysis software test 190 (e.g., via mis-compares), the resultant string can be used to search in the test definition file 188 to locate a specific algorithm for a programmed test plan. Further, the test definition file 188 also indicates if the algorithm being tested is hardwired or programmed. Further, in an embodiment, the default algorithm file 189 contains the definitions for each of the algorithms. For example, an algorithm can be defined as follows:

```
algorithm
{
name connectivity
{
(w0,r0)
(r0,w1)
dn(w1,r1)
dn(r1,w0)
}
}
```

In an embodiment, the analysis software test 190 correlates the information provided by the TDR dump file 185, the pattern control file 186, the TMFs 187*a-d*, the test definition file 188, and the default algorithm file 189 to generate the bit fail map report 195. In an embodiment, the TMFs 187*a-d* are utilized to describe the individual bits of the TDRs in the TDR dump file 185.

FIG. 4C illustrates another embodiment of the bit fail map in FIGS. 4A and 4B. In an embodiment, as depicted in the figure, the bit fail map report 195 includes information regarding the particular hardware used during test. For example, the bit fail map report 195 includes information regarding the particular AMU, SIU, and DCU used during the test. In addition, the bit fail map report 195 also includes information of the particular device targeted during the test. Further, the bit fail map report 195 also includes the state information associated with the test plan executed during the test. For example, the bit fail map report 195 includes information regarding the particular algorithm, address order ("AO"), address update ("AU"), sequence iterator ("SI"), data background ("DB"), and write port utilized during the test. Further, the bit fail map report 195 also includes the physical and logical address of the memory accessed during the test.

Accordingly, by utilizing real-time data collection (e.g., live mis-compare information) external to the memory under test as described in the present invention, the hardware cost and tester time associated with the test can be significantly reduced.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of Embodiments, with each claim standing on its own as a separate embodiment of the invention.

Moreover, it will be apparent to those skilled in the art from consideration of the specification and practice of the present disclosure that various modifications and variations can be made to the disclosed systems without departing from the scope of the disclosure, as claimed. Thus, it is intended that the specification and examples be considered as exemplary only, with a true scope of the present disclosure being indicated by the following claims and their equivalents.

The invention claimed is:

1. A memory built-in self-test ("MBIST") diagnostics system, comprising:
   a memory, wherein the memory is tested with an algorithm for a plurality of passes;
   a data compare unit;

a tester; and a processor, wherein:

during a first pass of the test, the data compare unit is configured to provide, to the tester, a clock cycle associated with a word of the memory including at least one mis-compare, during at least a second pass of the test, the data compare unit is further configured to (i) extract contents of the word based on the corresponding clock cycle and (ii) provide the extracted contents of the word to the tester, and the processor is configured to generate a bit fail map report based on the extracted contents of the word, wherein the bit fail map report includes information associated with the at least one mis-compare.

2. The diagnostics system of claim 1, wherein the clock cycle associated with the word and the extracted contents of the word are provided to the tester via a test access method.

3. The diagnostics system of claim 2, wherein the test access method is one of a Joint Test Action Group ("JTAG") interface and a direct access interface.

4. The diagnostics system of claim 1, wherein the data compare unit includes a data vector, wherein the contents of the word are extracted from the data vector.

5. The diagnostics system of claim 1, wherein the tester negatively adjusts the clock cycle.

6. The diagnostic system of claim 5, wherein the extracted contents of the word are associated with the adjusted clock cycle.

7. The diagnostics system of claim 5, further comprising:

a simulator, wherein the simulator is configured to test the memory with the algorithm in a simulation environment.

8. The diagnostics system of claim 7, wherein the simulation environment test is performed during one of (i) before the algorithm test for the plurality of passes, (ii) concurrent with the algorithm test for the plurality of passes, and (iii) after the algorithm test for the plurality of passes.

9. The diagnostics system of claim 7, wherein the simulator is further configured to (i) receive the adjusted clock cycle, (ii) extract information from the simulation environment based on the adjusted clock cycle, and (iii) store the extracted simulation environment information, the adjusted clock cycle, and the extracted contents of the word in a dump file.

10. The diagnostics system of claim 9, wherein the bit fail map report is generated with an analysis software test, wherein the analysis software test receives, as inputs, the dump file, a pattern control file, a plurality of mapping files, a test definition file, and a default algorithm file.

11. The diagnostics system of claim 10, wherein the bit fail map report is generated by correlating the dump file, the pattern control file, the plurality of mapping files, the test definition file, and the default algorithm file.

12. The diagnostics system of claim 1, further comprising:

at least one other memory, wherein the other memory is tested with another algorithm for another plurality of passes, wherein the at least one other memory is tested concurrently with the memory.

13. The diagnostics system of claim 1, further comprising:

at least one sequence iterator unit, wherein the at least one sequence iterator unit is configured to (i) generate read command and address instructions associated with the algorithm to provide to the memory and (ii) provide expected read data associated with the algorithm to the data compare unit.

14. The diagnostics system of claim 13, wherein the data compare unit is configured to (i) compare the expected read data with an output of the memory and (ii) provide a result of the comparison to a data vector.

15. The diagnostics system of claim 13, further comprising:

an algorithm memory unit, wherein the algorithm memory unit provides the algorithm to the at least one sequence iterator unit.

16. A diagnostics method for memory built-in self-test ("MBIST"), the method comprising:

testing a memory with an algorithm for a plurality of passes, wherein:

during a first pass of the test:

providing, with a data compare unit, a clock cycle associated with a word of the memory including at least one mis-compare to a tester, during at least a second pass of the test:

extracting, with the data compare unit, contents of the word based on the corresponding clock cycle, and providing, with the data compare unit, the extracted contents of the word to the tester; and generating, with a processor, a bit fail map report based on the extracted contents of the word, wherein the bit fail map report includes information associated with the at least one mis-compare.

17. The diagnostics method of claim 16, wherein the clock cycle is negatively adjusted by the tester, wherein the extracted contents of the word are associated with the adjusted clock cycle.

18. The diagnostics method of claim 17, further comprising:

simulating, with a simulator, a simulation environment test of the memory with the algorithm, wherein the simulation environment test is performed during one of (i) before the algorithm test for the plurality of passes, (ii) concurrent with the algorithm test for the plurality of passes, and (iii) after the algorithm test for the plurality of passes.

19. The diagnostics method of claim 18, further comprising:

receiving, with the simulator, the adjusted clock cycle;

extracting, with the simulator, information from the simulation environment based on the adjusted clock cycle; and storing, with the simulator, the extracted simulation environment information, the adjusted clock cycle, and the extracted contents of the word in a dump file.

20. The diagnostics method of claim 16, further comprising:

testing at least one other memory with another algorithm for another plurality of passes, wherein the at least one other memory is tested concurrently with the memory.

* * * * *